(12) United States Patent
Luo

(10) Patent No.: US 11,320,711 B1
(45) Date of Patent: May 3, 2022

(54) DISPLAY PANEL AND MANUFACTURING METHOD THEREOF

(71) Applicant: Wuhan China Star Optoelectronics Technology Co., Ltd., Wuhan (CN)

(72) Inventor: Chengzhi Luo, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 200 days.

(21) Appl. No.: 16/772,784

(22) PCT Filed: Nov. 11, 2019

(86) PCT No.: PCT/CN2019/116992
§ 371 (c)(1),
(2) Date: Jun. 14, 2020

(87) PCT Pub. No.: WO2021/047007
PCT Pub. Date: Mar. 18, 2021

(30) Foreign Application Priority Data

Sep. 12, 2019  (CN) .......................... 201910862817.2

(51) Int. Cl.
*G02F 1/1368* (2006.01)
*H01L 27/12* (2006.01)
*G02F 1/1362* (2006.01)

(52) U.S. Cl.
CPC ...... *G02F 1/1368* (2013.01); *G02F 1/136222* (2021.01); *H01L 27/1248* (2013.01); *H01L 27/1259* (2013.01)

(58) Field of Classification Search
CPC ............. G02F 1/1368; G02F 1/136222; H01L 27/1248; H01L 27/1259; H01L 27/3262; H01L 29/4908; H01L 27/3248; H01L 27/3258; H01L 27/3272
See application file for complete search history.

(56) References Cited

U.S. PATENT DOCUMENTS

| | | | |
|---|---|---|---|
| 9,048,455 B2 | 6/2015 | Lee | |
| 11,251,247 B2 * | 2/2022 | Kim | ................... H01L 27/3276 |
| 2014/0077197 A1 | 3/2014 | Toyoda et al. | |
| 2017/0222059 A1 | 8/2017 | Chen et al. | |
| 2019/0006524 A1 * | 1/2019 | Guo | ................. G02F 1/136209 |

FOREIGN PATENT DOCUMENTS

| | | | |
|---|---|---|---|
| CN | 105487718 | 4/2016 | |
| CN | 107315296 | 11/2017 | |
| CN | 108376687 | 8/2018 | |
| CN | 110196521 | 9/2019 | |
| CN | 110459578 A | * 11/2019 | ............. H01L 27/32 |

* cited by examiner

*Primary Examiner* — Douglas W Owens

(57) ABSTRACT

The present disclosure provides a display panel and a manufacturing method of the display panel, and the display panel includes an array substrate. The array substrate includes a planarization layer, a first protective layer, a first electrode layer, and a passivation layer. The passivation layer is made of silicon-based inorganic dielectric material. A first protective layer is added between the planarization layer and the first electrode layer to support the first electrode layer.

15 Claims, 5 Drawing Sheets

| Providing a substrate, wherein thin film transistors, a touch electrode, and a planarization layer are disposed on the substrate, and the thin film transistors comprise source-drain electrodes and an insulation interlayer. | ~ S10 |

↓

| Depositing a first protective layer on a side of the flat layer away from the substrate. | ~ S20 |

↓

| Depositing a first electrode layer on a side of the first protective layer away from the flat layer and exposing and etching the first electrode layer to form a first electrode pattern. | ~ S30 |

↓

| Depositing a passivation layer on a side of the first electrode layer away from the first protective layer and etching the passivation layer to define a first communication hole, a second communication hole, and a third communication hole. | ~ S40 |

↓

| Depositing a second electrode layer on the passivation layer and exposing and etching the second electrode layer to form a second electrode pattern. | ~ S50 |

FIG. 3

DISPLAY PANEL AND MANUFACTURING METHOD THEREOF

RELATED APPLICATIONS

This application is a National Phase of PCT Patent Application No. PCT/CN2019/116992 having International filing date of Nov. 11, 2019, which claims the benefit of priority of Chinese Patent Application No. 201910862817.2 filed on Sep. 12, 2019. The contents of the above applications are all incorporated by reference as if fully set forth herein in their entirety.

FIELD AND BACKGROUND OF THE INVENTION

The present disclosure relates to the field of display technologies, and particularly relates to a display panel and a manufacturing method of the display panel.

In recent years, thin film transistor liquid crystal display (TFT-LCD) technology is advancing on the development of power saving, high definition, and high color reproducibility. Among them, improvements on penetration performance and the brightness of TFT-LCDs and the reduction of power loss are difficulties that all panel manufacturers in the world are trying to overcome.

SUMMARY OF THE INVENTION

Transmissivity of TFT-LCD panels refers to a ratio of light intensity before and after backlight passes through the TFT-LCD panels. Generally, the transmittance of TFT-LCDs is only 3% to 10%, and more than 90% of the light cannot be exploited. For a TFT-LCD array substrate, in addition to metal wirings, a multilayer film structure composed of SiOx, SiNx and other materials have a great impact on the transmittance. A refractive index and an extinction coefficient of each film will affect the overall transmittance of the multilayer film structure. Therefore, the transmittance of the multilayer film structure can be improved by adjusting parameters such as the refractive index, the extinction coefficient, and a film structure of each film.

In summary, conventional display panels have a problem that light transmittance of the film layer is low. Therefore, it is necessary to provide a display panel and a manufacturing method of the display panel to fix this defect.

The embodiments of the present disclosure provide a display panel and a manufacturing method of the display panel, which are used to solve a problem of low light transmittance of a film layer of a conventional display panel.

An embodiment of the present disclosure provides a display panel including an array substrate, the array substrate includes:

a substrate;

a thin film transistor layer including a plurality of thin film transistors disposed in array, wherein the thin film transistors are disposed on the substrate;

a planarization layer disposed on a side of the thin film transistors away from the substrate;

a first protective layer disposed on a side of the planarization layer away from the thin film transistors;

a first electrode layer disposed on a side of the first protective layer away from the planarization layer;

a passivation layer disposed on a side of the first electrode layer away from the first protective layer and covering the first electrode layer and the first protective layer; and a second electrode layer disposed on a side of the passivation layer away from the first electrode layer;

wherein both the first protective layer and the passivation layer are made of silicon-based inorganic dielectric materials.

According to an embodiment of the present disclosure, the thin film transistors include source-drain electrodes and an insulation interlayer, a first communication hole is defined between the second electrode layer and the source-drain electrodes, and the second electrode layer is coupled to the source-drain electrodes through the first communication hole.

According to an embodiment of the present disclosure, the array substrate further includes a touch electrode, the touch electrode is disposed on the insulation interlayer, a second communication hole is defined between the second electrode layer and the touch electrode, the touch electrode and the second electrode layer are bridged through the second communication hole, a third communication hole is defined between the second electrode layer and the first electrode layer, and the second electrode layer and the first electrode layer are bridged through the third communication hole.

According to an embodiment of the present disclosure, the array substrate further includes a touch electrode, the touch electrode is disposed on the insulation interlayer, a fourth communication hole is defined between the first electrode layer and the touch electrode, the first electrode layer is coupled to the touch electrode through the fourth communication hole.

According to an embodiment of the present disclosure, both the first electrode layer and the second electrode layer are made of indium tin oxide.

According to an embodiment of the present disclosure, materials of the first protective layer and the passivation layer are $SiO_x$.

According to an embodiment of the present disclosure, the display panel further includes a liquid crystal layer and a color filter substrate disposed opposite to the array substrate, and the liquid crystal layer is disposed between the array substrate and the color filter substrate.

According to an embodiment of the present disclosure, a thickness of the passivation layer ranges from 500 A to 1500 A.

An embodiment of the present disclosure provides a display panel including an array substrate, the array substrate includes:

a substrate;

a thin film transistor layer including a plurality of thin film transistors disposed in array, wherein the thin film transistors are disposed on the substrate and include source-drain electrodes and an insulation interlayer;

a touch electrode disposed on the insulation interlayer;

a planarization layer disposed on a side of the thin film transistors away from the substrate;

a first protective layer disposed on a side of the planarization layer away from the thin film transistors;

a first electrode layer disposed on a side of the first protective layer away from the planarization layer;

a passivation layer disposed on a side of the first electrode layer away from the first protective layer and covering the first electrode layer and the first protective layer; and a second electrode layer disposed on a side of the passivation layer away from the first electrode layer;

wherein both the first protective layer and the passivation layer are made of silicon-based inorganic dielectric materials; a first communication hole is defined between the second electrode layer and the source-drain electrodes, and the second electrode layer is coupled to the source-drain electrodes through the first communication hole; a second communication hole is defined between the second electrode layer and the touch electrode, and the touch electrode and the second electrode layer are bridged through the second communication hole; and a third communication hole is defined between the second electrode layer and the first electrode layer, and the second electrode layer and the first electrode layer are bridged through the third communication hole.

According to an embodiment of the present disclosure, both the first electrode layer and the second electrode layer are made of indium tin oxide.

According to an embodiment of the present disclosure, materials of the first protective layer and the passivation layer are $SiO_x$.

According to an embodiment of the present disclosure, the display panel further includes a liquid crystal layer and a color filter substrate disposed opposite to the array substrate, and the liquid crystal layer is disposed between the array substrate and the color filter substrate.

According to an embodiment of the present disclosure, a thickness of the passivation layer ranges from 500 A to 1500 A.

An embodiment of the present disclosure also provides a manufacturing method of a display panel, including:

providing a substrate, wherein thin film transistors, a touch electrode, and a planarization layer are disposed on the substrate, and the thin film transistors include source-drain electrodes and an insulation interlayer;

depositing a first protective layer on a side of the planarization layer away from the substrate;

depositing a first electrode layer on a side of the first protective layer away from the planarization layer and exposing and etching the first electrode layer to form a first electrode pattern;

depositing a passivation layer on a side of the first electrode layer away from the first protective layer and etching the passivation layer to define a first communication hole, a second communication hole, and a third communication hole; and depositing a second electrode layer on the passivation layer and exposing and etching the second electrode layer to form a second electrode pattern;

wherein both the first protective layer and the passivation layer are made of silicon-based inorganic dielectric materials, the touch electrode and the second electrode layer are bridged through the second communication hole, the second electrode layer and the first electrode layer are bridged through the third communication hole, and the second electrode layer is coupled to the source-drain electrodes through the first communication hole.

According to an embodiment of the present disclosure, materials of the first protective layer and the passivation layer are $SiO_x$.

Beneficial effects of the present disclosure are: in the embodiments of the present disclosure, the passivation layer of the display panel is made of silicon-based inorganic dielectric material, so as to improve light transmittance of the passivation layer. To prevent the first electrode layer from collapsing when the passivation layer is formed by deposition, a first protective layer made of silicon-based inorganic dielectric material is added between the planarization layer and the first electrode layer. Without affecting the light transmittance of the display panel, the first protective layer is used to support the first electrode layer, thereby improving the light transmittance of the display panel.

BRIEF DESCRIPTION OF THE SEVERAL VIEWS OF THE DRAWINGS

In order to more clearly illustrate the technical solutions in the embodiments or in prior art, the drawings to be used in the descriptions of the embodiments or the prior art will be briefly described below. Obviously, the drawings in the following description are merely embodiments of the present disclosure. For those of ordinary skill in the art, other drawings may be obtained from the drawings without any creative work.

FIG. 3 is a process diagram of a manufacturing method of a display panel according to a third embodiment of the present disclosure;

DESCRIPTION OF SPECIFIC EMBODIMENTS OF THE INVENTION

Figure 1:
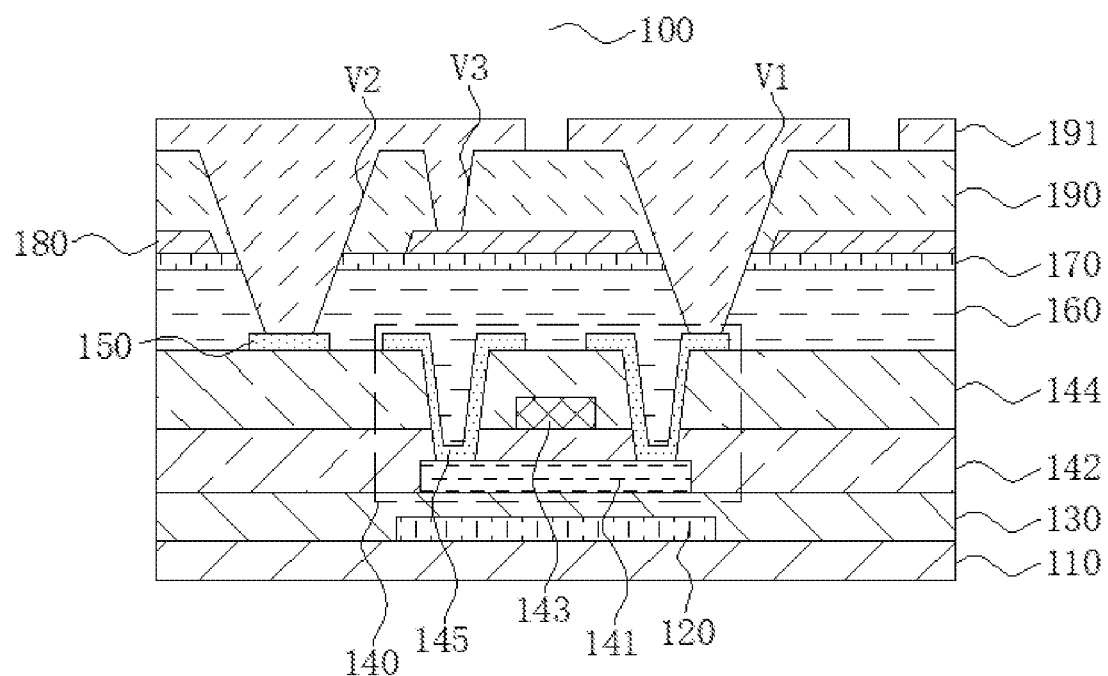
FIG. 1 is a cross-sectional and schematic view of a display panel according to a first embodiment of the present disclosure.

Following descriptions of the embodiments are with reference to the attached drawings, which are used to illustrate specific embodiments that can be implemented by the present disclosure.

The orientational terms mentioned in the present disclosure, such as "up", "down", "front", "rear", "left", "right", "inside", "outside", "side", etc., are only the directions in the drawings. The orientational terms used herein are used to explain the present disclosure, rather than to limit the protection scope of the present disclosure. In the drawings, components having similar structures are denoted by same numerals.

The disclosure is further described below with reference to the drawings and specific embodiments:

EMBODIMENT 1

The embodiment of the present disclosure provides a display panel, which is described in detail below with reference to FIG. 1.

As shown in FIG. 1, it is a cross-sectional and schematic view of the display panel in the embodiment of the present disclosure. The display panel includes an array substrate 100. The array substrate 100 includes: a substrate 110, a thin film transistor layer including a plurality of thin film transistors 140 disposed in array and on the substrate 110, and a planarization layer 160 disposed on a side of the thin film transistors 140 away from the substrate 110. The thin film transistor 140 includes source-drain electrodes 145 and an insulation interlayer 144. The planarization layer 160 covers the insulation interlayer 144 and the source-drain electrodes 145.

The array substrate 100 further includes: a first protective layer 170 disposed on a side of the planarization layer 160 away from the thin film transistors 140, a first electrode layer 180 disposed on a side of the first protective layer 170 away from the planarization layer 160, a passivation layer 190 disposed on a side of the first electrode layer 180 away from the first protective layer 170, and a second electrode layer 191 disposed on a side of the passivation layer 190 away from the first electrode layer 180. Wherein, the passivation layer 190 covers the first electrode layer 180 and the first protective layer 170. Materials of the first protective layer 170 and the passivation layer 190 are silicon-based inorganic dielectric materials. The silicon-based inorganic dielectric materials include $SiN_x$ and $SiO_x$. The first protective layer 170 is used to support the first electrode layer 180, thereby preventing the first electrode layer 180 from collapsing when the passivation layer 190 is formed by deposition.

Preferably, among the silicon-based inorganic dielectric materials, an extinction coefficient of $SiN_x$ is greater than an extinction coefficient of $SiO_x$. Therefore, when light passes through a film layer containing $SiN_x$, a light loss rate will be greater than a light loss rate of the film layer containing $SiO_x$, resulting in lower light transmittance of the display panel. To improve the light transmittance of the film layer, materials of the first protective layer 170 and the passivation layer 190 may be $SiO_x$. Due to a presence of the first protective layer 170, when the passivation layer 190 is formed by deposition, the $N_2O$ gas will etch the planarization layer 160. However, since the first protective layer 170 is provided between the planarization layer 160 and the first electrode layer 180, the first protective layer 170 supports the first electrode layer 180 to prevent the first electrode layer 180 from collapsing.

As shown in FIG. 1, the array substrate 100 further includes a light shielding layer 120 and a buffer layer 130. The light shielding layer 120 is disposed between the thin film transistors 140 and the substrate 110, and overlaps a projection position of the thin film transistors 140 on the substrate 110 along a thickness direction of the array substrate 100. The buffer layer 130 is disposed between the substrate 110 and the thin film transistors 140, and covers the light shielding layer 120.

In this embodiment, as shown in FIG. 1, the thin film transistor 140 further includes a channel layer 141, a gate insulating layer 142, and a gate line layer 143. Both the channel layer 141 and the gate insulating layer 142 are disposed on the buffer layer 130, and the gate insulating layer 142 covers the channel layer 141.

Preferably, materials of the insulation interlayer 144 and the buffer layer 130 are $SiO_x$. Since the extinction coefficient of $SiO_x$ is less than the extinction coefficient of $SiN_x$, light transmittance of the insulation interlayer 144 and light transmittance of the buffer layer 130 can be improved.

As shown in FIG. 1, in this embodiment, a first communication hole V1 is defined between the second electrode layer 191 and the source-drain electrodes 145. The first communication hole V1 passes through the passivation layer 190, the first electrode layer 180, the first protective layer 170, and the planarization layer 160. The second electrode layer 191 is coupled to the source-drain electrodes 145 through the first communication hole V1.

In this embodiment, the array substrate 100 further includes a touch electrode 150. The touch electrode 150 and the source-drain electrodes 145 are disposed on the insulation interlayer 144. A second communication hole V2 is defined between the second electrode layer 191 and the touch electrode 150. The second communication hole V2 passes through the passivation layer 190, the first electrode layer 180, the first protective layer 170, and the planarization layer 160. The touch electrode 150 and the second electrode layer 191 are bridged through the second communication hole V2. A third communication hole V3 is defined between the second electrode layer 191 and the first electrode layer 180. The third communication hole V3 passes through the passivation layer 190, the second electrode layer 191 and the first electrode layer 180 are bridged through the third communication hole V3.

The first electrode layer 180 and the touch electrode 150 are connected in a bridge manner. When the first communication hole V1 is formed by etching, the second communication hole V2 and the third communication hole V3 are together formed by etching, and a communication hole separately etched in the planarization layer 160 and defined between the first electrode layer 180 and the touch electrode 150 can be omitted, thereby simplifying a complexity of the process and reducing actual production cost.

In this embodiment, both the first electrode layer 180 and the second electrode layer 191 are made of indium tin oxide. The first electrode layer 180 is a common electrode layer, and the second electrode layer 191 is a pixel electrode layer.

In this embodiment, the display panel is a liquid crystal display panel. The display panel further includes a liquid crystal layer (not shown in the figures) and a color filter substrate disposed opposite to the array substrate 100. The liquid crystal layer is disposed between the array substrate 100 and the color filter substrate.

In this embodiment, a thickness of the passivation layer ranges from 500 A to 1500 A.

In the embodiment of the present disclosure, the passivation layer 190 of the display panel is made of silicon-based inorganic dielectric material, so as to improve light transmittance of the passivation layer 190. To prevent the first electrode layer 180 from collapsing when the passivation layer 190 is formed by deposition, a first protective layer 170 made of silicon-based inorganic dielectric material is added between the planarization layer 160 and the first electrode layer 180. Without affecting the light transmittance of the display panel, the first protective layer 170 is used to support the first electrode layer 180, thereby improving the light transmittance of the display panel, improving the brightness of the display panel, and reducing power loss of the display panel.

EMBODIMENT 2

The embodiment of the present disclosure provides a display panel, which is described in detail below with reference to FIG. 2.

Figure 2:
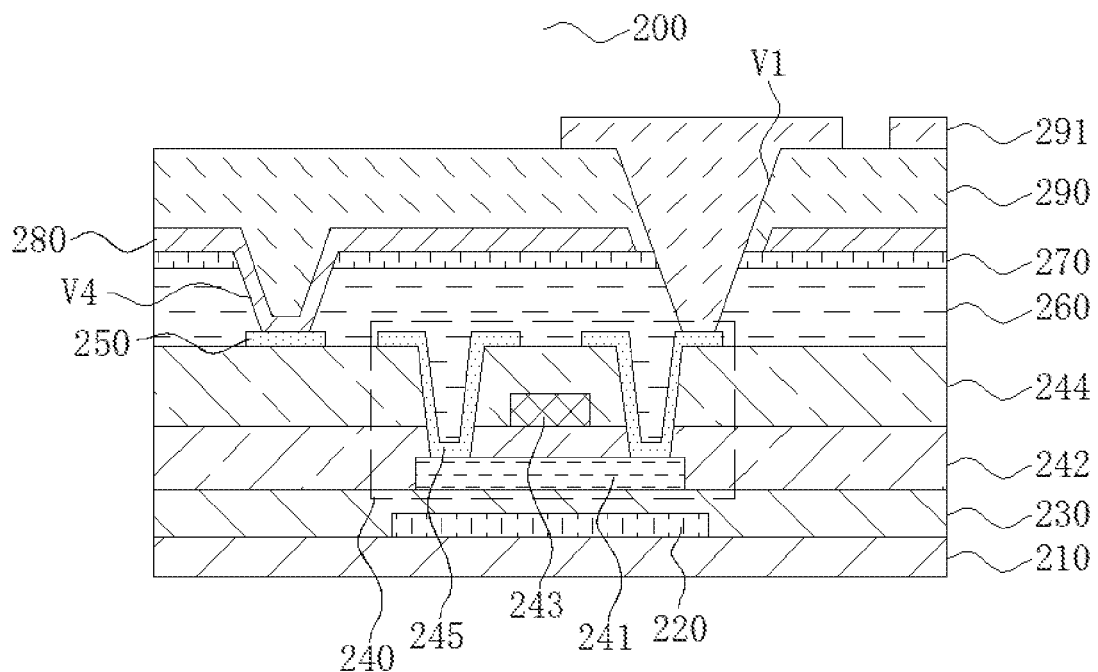
FIG. 2 is a cross-sectional and schematic view of a display panel according to a second embodiment of the present disclosure.

As shown in FIG. 2, it is a cross-sectional and schematic view of the display panel in the embodiment of the present disclosure. The display panel includes an array substrate 200. The array substrate 200 includes: a substrate 210, a thin film transistor layer including a plurality of thin film transistors 240 disposed in array and on the substrate 210, and a planarization layer 260 disposed on a side of the thin film transistors 240 away from the substrate 210. The thin film transistor 240 includes source-drain electrodes 245 and an insulation interlayer 244. The planarization layer 260 covers the insulation interlayer 244 and the source-drain electrodes 245.

The array substrate 200 further includes: a first protective layer 270 disposed on a side of the planarization layer 260 away from the thin film transistors 240, a first electrode layer 280 disposed on a side of the first protective layer 270 away from the planarization layer 260, a passivation layer 290 disposed on a side of the first electrode layer 280 away from the first protective layer 270, and a second electrode layer 291 disposed on a side of the passivation layer 290 away from the first electrode layer 280. Wherein, the passivation layer 290 covers the first electrode layer 280 and the first protective layer 270. Materials of the first protective layer 270 and the passivation layer 290 are silicon-based inorganic dielectric materials. The silicon-based inorganic dielectric materials include $SiN_x$ and $SiO_x$. The first protective layer 270 is used to support the first electrode layer 280, thereby preventing the first electrode layer 280 from collapsing when the passivation layer 290 is formed by deposition.

Preferably, among the silicon-based inorganic dielectric materials, an extinction coefficient of $SiN_x$ is greater than an extinction coefficient of $SiO_x$. Therefore, when light passes through a film layer containing $SiN_x$, a light loss rate will be greater than a light loss rate of the film layer containing $SiO_x$, resulting in lower light transmittance of the display panel. To improve the light transmittance of the film layer, materials of the first protective layer 270 and the passivation layer 290 may be $SiO_x$. Due to presence of the first protective layer 270, when the passivation layer 290 is formed by deposition, the $N_2O$ gas will etch the planarization layer 260. However, since the first protective layer 270 is provided between the planarization layer 260 and the first electrode layer 280, the first protective layer 270 supports the first electrode layer 280 to prevent the first electrode layer 280 from collapsing.

As shown in FIG. 2, the array substrate 200 further includes a light shielding layer 220 and a buffer layer 230. The light shielding layer 220 is disposed between the thin film transistors 240 and the substrate 210, and overlaps a projection position of the thin film transistors 240 on the substrate 210 along a thickness direction of the array substrate 200. The buffer layer 230 is disposed between the substrate 210 and the thin film transistors 240 and covers the light shielding layer 220.

In this embodiment, as shown in FIG. 2, the thin film transistor 240 further includes a channel layer 241, a gate insulating layer 242, and a gate line layer 243. Both the channel layer 241 and the gate insulating layer 242 are disposed on the buffer layer 230, and the gate insulating layer 242 covers the channel layer 241.

As shown in FIG. 2, in this embodiment, a first communication hole V1 is defined between the second electrode layer 291 and the source-drain electrodes 245. The first communication hole V1 passes through the passivation layer 290, the first electrode layer 280, the first protective layer 270, and the planarization layer 260. The second electrode layer 291 is coupled to the source-drain electrodes 245 through the first communication hole V1.

In this embodiment, the array substrate 200 further includes a touch electrode 250. The touch electrode 250 and the source-drain electrodes 245 are disposed on the insulation interlayer 244. A fourth communication hole V4 is defined between the first electrode layer 280 and the touch electrode 250. The first electrode layer 280 is coupled to the touch electrode 250 through the fourth communication hole V4.

In this embodiment, both the first electrode layer 280 and the second electrode layer 291 are made of indium tin oxide. The first electrode layer 280 is a common electrode layer, and the second electrode layer 291 is a pixel electrode layer.

In this embodiment, the display panel is a liquid crystal display panel. The display panel further includes color filter substrate disposed opposite to the array substrate 200 and a liquid crystal layer (not shown in the figures). The liquid crystal layer is disposed between the array substrate 200 and the color filter substrate.

In the embodiment of the present disclosure, the passivation layer 290 of the display panel is made of silicon-based inorganic dielectric material, so as to improve light transmittance of the passivation layer 290. To prevent the first electrode layer 280 from collapsing when the passivation layer 290 is formed by deposition, a first protective layer 270 made of silicon-based inorganic dielectric material is added between the planarization layer 260 and the first electrode layer 280. Without affecting the light transmittance of the display panel, the first protective layer 270 is used to support the first electrode layer 280, thereby improving the light transmittance of the display panel, improving the brightness of the display panel, and reducing power loss of the display panel.

EMBODIMENT 3

The embodiment of the present disclosure provides a manufacturing method of a display panel, which is described in detail below with reference to FIG. 3 to FIG. 4E.

As shown in FIG. 3, it is a process diagram of a manufacturing method of a display panel in the embodiment of the present disclosure. FIG. 4A to FIG. 4E are cross-sectional and schematic views of the display panel in the embodiment of the present disclosure. The method includes:

Step S10: providing a substrate 310, wherein thin film transistors 340, a touch electrode 350, and a planarization layer 360 are disposed on the substrate, and the thin film transistor 340 includes source-drain electrodes 345 and an insulation interlayer 344.

Figure 4A:
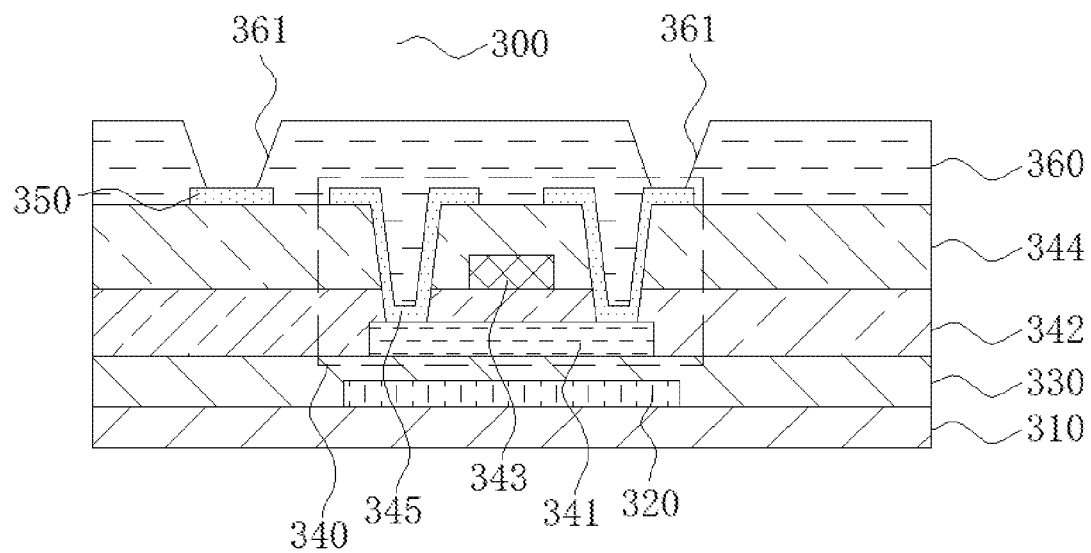
FIG. 4A is a cross-sectional and schematic view of the display panel according to the third embodiment of the present disclosure.

As shown in FIG. 4A, the touch electrode 350 and the source-drain electrodes 345 are disposed on the insulation interlayer 344. A light shielding layer 320 and a buffer layer 330 are disposed between the substrate 310 and the thin film transistors 340. The thin film transistor 340 further includes a gate insulating layer 342, a channel layer 341, and a gate line layer 343. A plurality of via holes 361 are defined in the planarization layer 360 by etching. The via holes 361 expose the touch electrode 350 and the source-drain electrodes 345 located under the planarization layer 360.

Figure 4B:
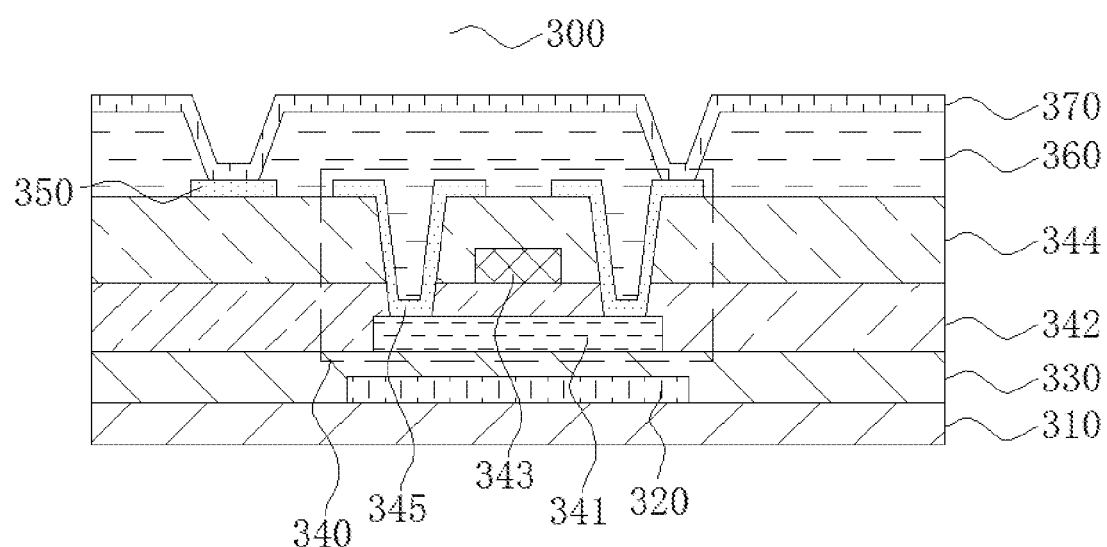
FIG. 4B is a cross-sectional and schematic view of the display panel according to the third embodiment of the present disclosure.

Step S20: depositing a first protective layer 370 on a side of the planarization layer 360 away from the substrate 310. As shown in FIG. 4B, the first protective layer 370 covers the planarization layer 360, and also covers the touch electrode 350 and source-drain electrodes 345 exposed by the via holes 361.

Figure 4C:
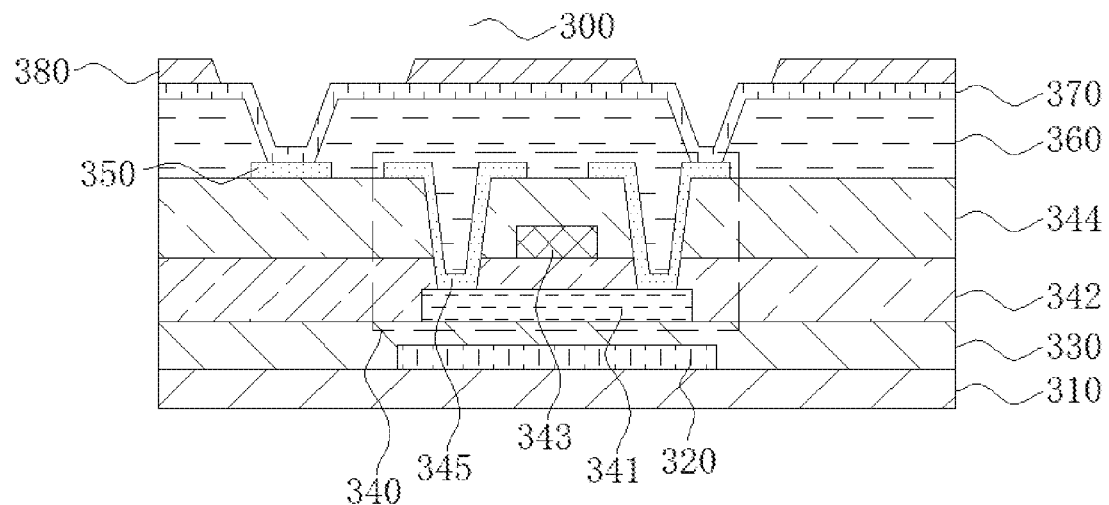
FIG. 4C is a cross-sectional and schematic view of the display panel according to the third embodiment of the present disclosure.

Step S30: as shown in FIG. 4C, depositing a first electrode layer 380 on a side of the first protective layer 370 away from the planarization layer 360, and exposing and etching the first electrode layer 380 to form a first electrode pattern.

Figure 4D:
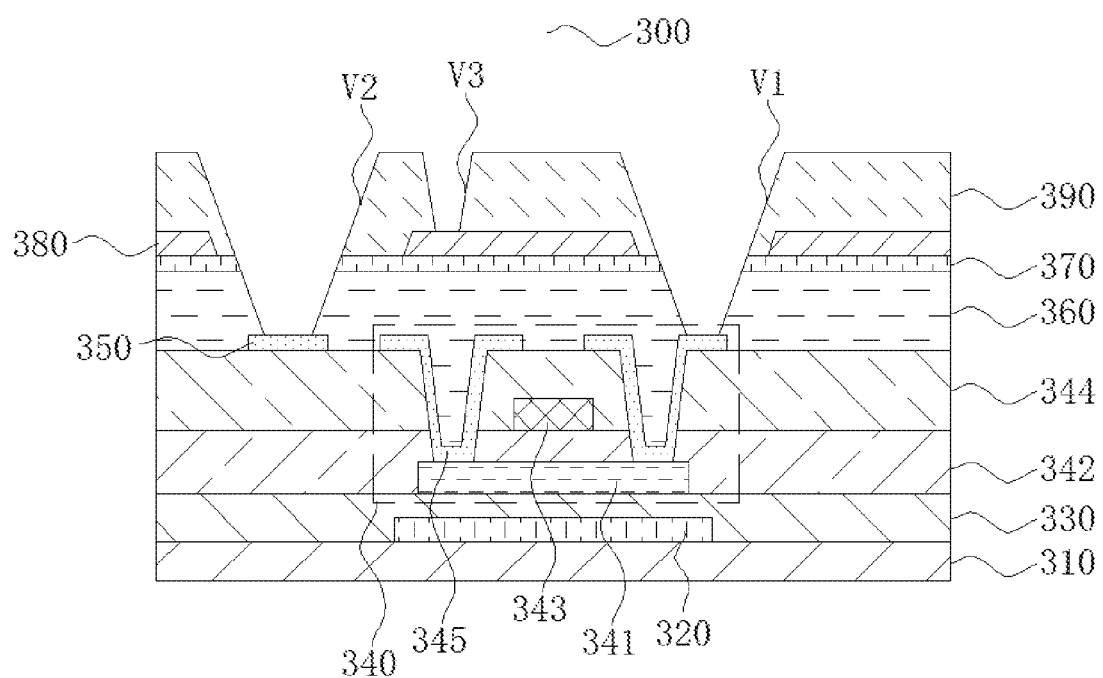
FIG. 4D is a cross-sectional and schematic view of the display panel according to the third embodiment of the present disclosure.

Step S40: depositing a passivation layer 390 on a side of the first electrode layer 380 away from the first protective layer 370 and etching the passivation layer 390 to define a first communication hole V1, a second communication hole V2, and a third communication hole V3. As shown in FIG. 4D, both the first communication hole V1 and the second communication hole V2 pass through the passivation layer 390, the first electrode layer 380, the first protective layer 370, and the planarization layer 360, and expose the touch electrode 350. The third communication hole V3 passes through the passivation layer 390 and exposes the first electrode layer 380.

Step S50: depositing a second electrode layer 391 on the passivation layer 390 and exposing and etching the second electrode layer 391 to form a second electrode pattern.

Figure 4E:
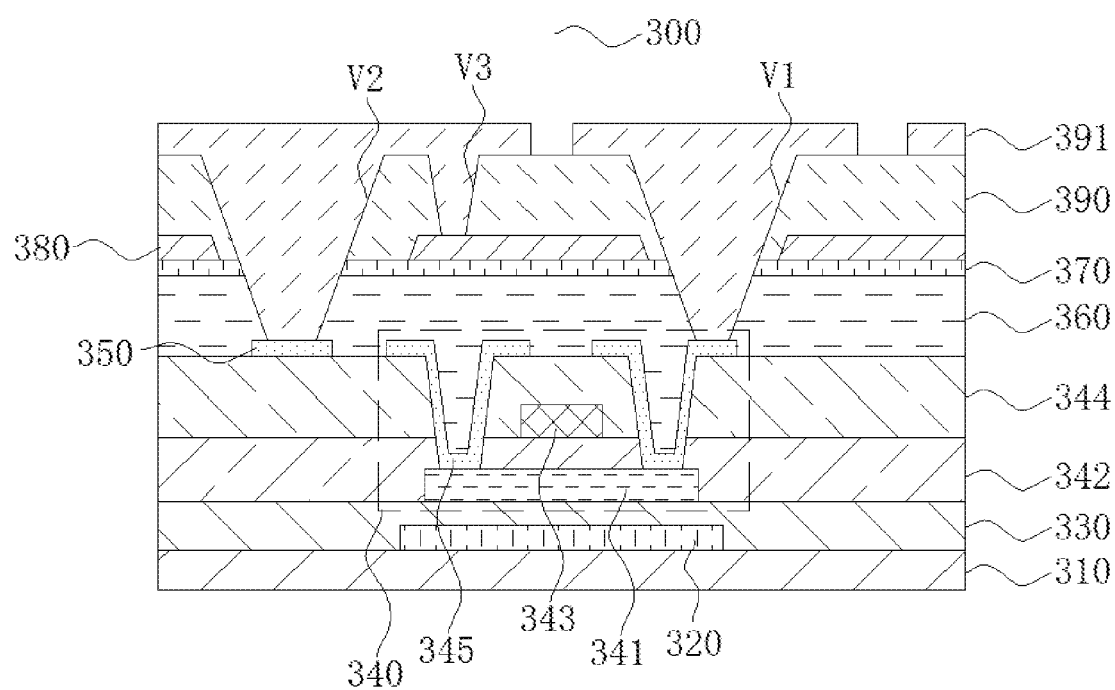
FIG. 4E is a cross-sectional and schematic view of the display panel according to the third embodiment of the present disclosure.

As shown in FIG. 4E, the touch electrode 350 and the second electrode layer 391 are bridged through the second communication hole V2. The second electrode layer 391 and the first electrode layer 380 are bridged through the third communication hole V3. And the source-drain electrodes 345 are coupled to the second electrode layer 391 through the first communication hole V1.

The first electrode layer 380 and the touch electrode 350 are connected in a bridge manner. When the first communication hole V1 is formed by etching, the second communication hole V2 and the third communication hole V3 are together formed by etching, and a communication hole separately etched in the planarization layer 360 and defined between the first electrode layer 380 and the touch electrode 350 can be omitted, thereby simplifying a complexity of the process and reducing an actual production cost. At the same time, in order to avoid the first electrode layer 380 from collapsing due to the planarization layer 360 being etched when the passivation layer 390 is deposited, a first protective layer 370 is added, and the first protective layer 370 is configured to support the first electrode layer 380.

In this embodiment, materials of the first protective layer 370 and the passivation layer 390 are silicon-based inorganic dielectric materials. The silicon-based inorganic dielectric materials include $SiN_x$ and $SiO_x$.

Preferably, among the silicon-based inorganic dielectric materials, an extinction coefficient of $SiN_x$ is greater than an extinction coefficient of $SiO_x$. Therefore, when light passes through a film layer containing $SiN_x$, a light loss rate will be greater than a light loss rate of the film layer containing $SiO_x$, resulting in lower light transmittance of the display panel. To improve the light transmittance of the film layer, materials of the first protective layer 370 and the passivation layer 390 may be $SiO_x$.

In this embodiment, in the step S20, the first protective layer 370 is formed by chemical vapor deposition. In order to reduce the etching of the planarization layer 360 during the deposition process, $SiO_x$ with a thickness of 200 A is deposited at a low power with a power range of 1000 W to 3000 W, and then $SiO_x$ with a thickness of 800 A is deposited at a high power with a power range of 6000 W to 10000 W, based on the previous deposition, thereby forming the first protective layer 370.

In this embodiment, in the step S30, a method for depositing and forming the first electrode layer 380 is a physical vapor deposition method, and a thickness of the first electrode layer 380 ranges from 300 A to 1000 A.

In this embodiment, in the step S40, a method for depositing and forming the passivation layer 390 is a chemical vapor deposition method, and a thickness of the passivation layer 390 ranges from 500 A to 1500 A.

In this embodiment, in the step S50, a method for depositing and forming the second electrode layer 391 is a physical vapor deposition method, and a thickness of the second electrode layer 391 ranges from 300 A to 1000 A.

In the embodiment of the present disclosure, the passivation layer 390 of the display panel is made of silicon-based inorganic dielectric material, so as to improve light transmittance of the passivation layer 390. To prevent the first electrode layer 380 from collapsing when the passivation layer 390 is formed by deposition, a first protective layer 370 made of silicon-based inorganic dielectric material is added between the planarization layer 360 and the first electrode layer 380. Without affecting the light transmittance of the display panel, the first protective layer 370 is used to support the first electrode layer 380. At the same time, the touch electrode 350 and the second electrode layer 391 are bridged through the second communication hole V2, and the second electrode layer 391 and the first electrode layer 380 are bridged through the third communication hole V3, thereby improving the light transmittance of the display panel, improving the brightness of the display panel, reducing power loss of the display panel, simplifying a complexity of the process, and reducing production cost.

In summary, although the present disclosure is disclosed as above with the preferred embodiments, the above-mentioned preferred embodiments are not intended to limit the present disclosure. Those skilled in the art can make various modifications and improvements without departing from the spirit and scope of the present disclosure. Therefore, a protection scope of the disclosure is based on a scope defined by the claims.

What is claimed is:

1. A display panel, comprising:
   an array substrate, comprising:
      a substrate;
      a thin film transistor layer comprising a plurality of thin film transistors disposed in array, wherein the thin film transistors are disposed on the substrate;
      a planarization layer disposed on a side of the thin film transistors away from the substrate;
      a first protective layer disposed on a side of the planarization layer away from the thin film transistors;
      a first electrode layer disposed on a side of the first protective layer away from the planarization layer;
      a passivation layer disposed on a side of the first electrode layer away from the first protective layer and covering the first electrode layer and the first protective layer; and
      a second electrode layer disposed on a side of the passivation layer away from the first electrode layer;
   wherein both the first protective layer and the passivation layer are made of silicon-based inorganic dielectric materials.

2. The display panel as claimed in claim 1, wherein the thin film transistors comprise source-drain electrodes and an insulation interlayer, a first communication hole is defined between the second electrode layer and the source-drain electrodes, and the second electrode layer is coupled to the source-drain electrodes through the first communication hole.

3. The display panel as claimed in claim 2, wherein the array substrate further comprises a touch electrode, the touch electrode is disposed on the insulation interlayer, a second communication hole is defined between the second electrode layer and the touch electrode, the touch electrode and the second electrode layer are bridged through the second communication hole, a third communication hole is defined between the second electrode layer and the first electrode layer, and the second electrode layer and the first electrode layer are bridged through the third communication hole.

4. The display panel as claimed in claim 2, wherein the array substrate further comprises a touch electrode, the touch electrode is disposed on the insulation interlayer, a fourth communication hole is defined between the first electrode layer and the touch electrode, the first electrode layer is coupled to the touch electrode through the fourth communication hole.

5. The display panel as claimed in claim 1, wherein both the first electrode layer and the second electrode layer are made of indium tin oxide.

6. The display panel as claimed in claim 1, wherein materials of the first protective layer and the passivation layer are $SiO_x$.

7. The display panel as claimed in claim 1, wherein the display panel further comprises a liquid crystal layer and a color filter substrate disposed opposite to the array substrate, and the liquid crystal layer is disposed between the array substrate and the color filter substrate.

8. The display panel as claimed in claim 1, wherein a thickness of the passivation layer ranges from 500 A to 1500 A.

9. A display panel, comprising:
an array substrate, comprising:
a substrate;
a thin film transistor layer comprising a plurality of thin film transistors disposed in array, wherein the thin film transistors are disposed on the substrate and comprise source-drain electrodes and an insulation interlayer;
a touch electrode disposed on the insulation interlayer;
a planarization layer disposed on a side of the thin film transistors away from the substrate;
a first protective layer disposed on a side of the planarization layer away from the thin film transistors;
a first electrode layer disposed on a side of the first protective layer away from the planarization layer;
a passivation layer disposed on a side of the first electrode layer away from the first protective layer, and covering the first electrode layer and the first protective layer; and
a second electrode layer disposed on a side of the passivation layer away from the first electrode layer;
wherein both the first protective layer and the passivation layer are made of silicon-based inorganic dielectric materials; a first communication hole is defined between the second electrode layer and the source-drain electrodes, and the second electrode layer is coupled to the source-drain electrodes through the first communication hole; a second communication hole is defined between the second electrode layer and the touch electrode, and the touch electrode and the second electrode layer are bridged through the second communication hole; and a third communication hole is defined between the second electrode layer and the first electrode layer, and the second electrode layer and the first electrode layer are bridged through the third communication hole.

10. The display panel as claimed in claim 9, wherein both the first electrode layer and the second electrode layer are made of indium tin oxide.

11. The display panel as claimed in claim 9, wherein materials of the first protective layer and the passivation layer are $SiO_x$.

12. The display panel as claimed in claim 9, wherein the display panel further comprises a liquid crystal layer and a color filter substrate disposed opposite to the array substrate, and the liquid crystal layer is disposed between the array substrate and the color filter substrate.

13. The display panel as claimed in claim 9, wherein a thickness of the passivation layer ranges from 500 A to 1500 A.

14. A manufacturing method of a display panel, comprising:
providing a substrate, wherein thin film transistors, a touch electrode, and a planarization layer are disposed on the substrate, and the thin film transistors comprise source-drain electrodes and an insulation interlayer;
depositing a first protective layer on a side of the planarization layer away from the substrate;
depositing a first electrode layer on a side of the first protective layer away from the planarization layer and exposing and etching the first electrode layer to form a first electrode pattern;
depositing a passivation layer on a side of the first electrode layer away from the first protective layer and etching the passivation layer to define a first communication hole, a second communication hole, and a third communication hole; and
depositing a second electrode layer on the passivation layer and exposing and etching the second electrode layer to form a second electrode pattern;
wherein both the first protective layer and the passivation layer are made of silicon-based inorganic dielectric materials, the touch electrode and the second electrode layer are bridged through the second communication hole, the second electrode layer and the first electrode layer are bridged through the third communication hole, and the second electrode layer is coupled to the source-drain electrodes through the first communication hole.

15. The manufacturing method of the display panel as claimed in claim 14, wherein materials of the first protective layer and the passivation layer are $SiO_x$.

* * * * *